US012550247B2

(12) United States Patent
Chu et al.

(10) Patent No.: US 12,550,247 B2
(45) Date of Patent: Feb. 10, 2026

(54) PADDLE CARD OPTIMIZATION

(71) Applicant: DELL PRODUCTS L.P., Round Rock, TX (US)

(72) Inventors: Chang-Kai Chu, Zhongli District (TW); Pei-Ju Lin, Taoyuan District (TW); Ching-Huei Chen, Taoyuan (TW); Bhyrav Mutnury, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 31 days.

(21) Appl. No.: 18/772,627

(22) Filed: Jul. 15, 2024

(65) Prior Publication Data

US 2026/0020140 A1    Jan. 15, 2026

(51) Int. Cl.
*H05K 9/00* (2006.01)
*H05K 1/02* (2006.01)

(52) U.S. Cl.
CPC ......... *H05K 1/0215* (2013.01); *H05K 1/0216* (2013.01); *H05K 9/0098* (2013.01); *H05K 2201/0707* (2013.01)

(58) Field of Classification Search
CPC .................................................. H05K 9/0098
See application file for complete search history.

(56) References Cited

U.S. PATENT DOCUMENTS

| | | | |
|---|---|---|---|
| 8,371,877 B2 * | 2/2013 | Kooiman | H01R 13/65918 439/620.22 |
| 11,705,649 B2 | 7/2023 | Ayzenberg et al. | |
| 2016/0351298 A1 * | 12/2016 | Gundel | H05K 9/0064 |
| 2018/0233838 A1 * | 8/2018 | Ishimatsu | H01R 12/53 |
| 2018/0294076 A1 * | 10/2018 | Farkas | H05K 3/3405 |
| 2020/0112115 A1 * | 4/2020 | Vana, Jr. | H01R 12/771 |
| 2023/0032371 A1 | 2/2023 | Farkas et al. | |
| 2023/0066194 A1 * | 3/2023 | Kobayashi | H05K 9/0084 |

* cited by examiner

*Primary Examiner* — Hung V Ngo
(74) *Attorney, Agent, or Firm* — Larson Newman, LLP

(57) ABSTRACT

A paddle card includes a printed circuit board (PCB), a shielded cable, and an electromagnetic interference (EM) shield. The PCB includes a first metal layer on a top surface of the PCB, a second metal layer within the PCB, and a cavity in the top surface of the PC. The cavity exposes the second metal layer. The first metal layer includes a first ground pad. The second metal layer includes a signal pad located within the cavity. The shielded cable includes a signal conductor coupled to the first signal pad. The EMI shield is coupled to the ground pad and covers the cavity.

20 Claims, 4 Drawing Sheets

Top View

Side View

PADDLE CARD OPTIMIZATION

FIELD OF THE DISCLOSURE

This disclosure generally relates to information handling systems, and more particularly relates to paddle card optimization in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A paddle card may include a printed circuit board (PCB), a shielded cable, and an electromagnetic interference (EM) shield. The PCB may include a first metal layer on a top surface of the PCB, a second metal layer within the PCB, and a cavity in the top surface of the PC. The cavity may expose the second metal layer. The first metal layer may include a ground pad. The second metal layer may include a signal pad located within the cavity. The shielded cable may include a signal conductor coupled to the first signal pad. The EMI shield may be coupled to the ground pad and covers the cavity.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
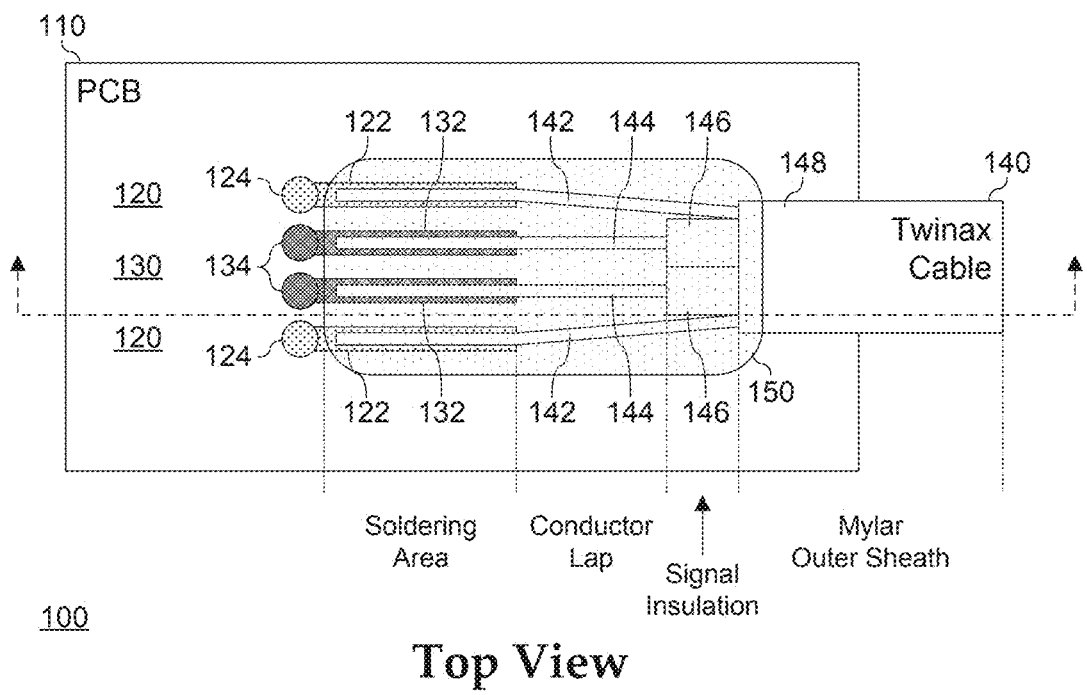
FIG. 1 is a diagram illustrating a paddle card a may be known in the art.
Figure 1:
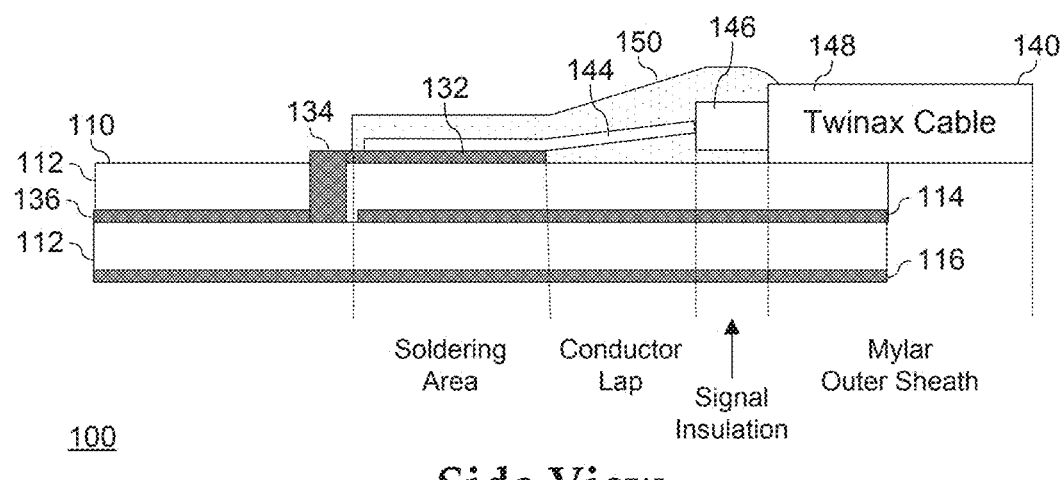

FIG. 1 illustrates a paddle card 100 as may be known in the art. Paddle card 100 is illustrated in a top view and in a side view, and includes a printed circuit board (PCB) 110 and a twin axial (twinax) cable 140. Paddle card 100 represents an interconnection device for connecting an information handling system to one or more device. As such, paddle card 100 will be understood to include a connector (not illustrated) that is configured to be plugged into a socket affixed to the information handling system. The connector provides electrical signals that are routed through PCB 110 to twinax cable 120. In particular, the electrical signals traverse various traces and vias patterned in PCB 110 to signal pads that are exposed on a surface of the PCB. Twinax cable 140 includes various signal and ground wires that are soldered to the signal pads to route the electrical signals to devices connected to the other end of the twinax cable. Twinax cable 140 is typically mechanically secured to PCB 110 in order to provide strain relieve to the soldered wires, as needed or desired. In this regard, the details of the mechanical attachment of twinax cables to PCBs are known in the art and will not be further described herein, except as may be needed to illustrate the current embodiment.

PCB 110 includes signal reference ground structures 120 and differential signal structures 130. Ground structures 120 include ground pads 122 that are connected to ground vias 124 that are in turn connected to a ground layer (not illustrated) within PCB 110. Signal structures 130 include signal pads 132 that are connected to signal vias 134 that are in turn connected to associated signal traces 136 on a metal layer 114 within PCB 110. Pads 122 and 132 are formed on a top surface of an insulating layer 112. Signal traces 136 are formed in a metal layer 114 on a bottom surface of insulating layer 112. PCB 110 may further include one or more insulating layer 112 and one or more metal layer 116, as needed or desired.

Twinax cable 140 includes a pair of ground wires 142, a pair of signal wires 144, signal insulation 146, and an outer mylar sheath 148. In a particular case, twinax cable 140 is configured to provide differential signals on signal wires 144, and each signal wire is surrounded by signal insulation 146. Typically, ground wires 142 are provided in a line with, and outside of signal wires 144 to provide a reference ground to the differential signals carried on the signal wires. The assembly of ground wires 142, signal wires 144, and signal insulation 144 is typically wrapped with a shielding layer, such as an aluminum foil wrapping or the like, and mylar sheath 148 encloses the entire assembly. Other configurations of twinax cable are known in the art, and may be utilized in keeping with the prior art. The configurations of twinax cables are known in the art and will not be further described herein, except as may be needed to illustrate the current embodiments.

In assembling paddle card 100, twinax cable 140 is stripped to expose wires 142 and 144, the exposed wires are soldered to respective pads 122 and 132, and an epoxy resin 150 is applied to the exposed wires and solder joints. Epoxy resin 150 is applied to protect wires 142 and 144 and the solder joints, and to assist in the mechanical attachment of the twinax cable to PCB 110. As such, the interconnection between PCB 110 and twinax cable 140 may be divided up into a soldering area, a conductor lap area, a signal insulation area, and a mylar sheath area. The soldering area is where wires 142 and 144 are soldered to respective pads 122 and 132. The conductor lap area is where the wires transition from a height where the wires emerge from the twinax cable to the surface of the PCB. The signal insulation area is where signal insulation 146 emerges from twinax cable 140. The mylar sheath area represents the bulk of twinax cable 140.

Paddle card 100 may include one or more additional twinax cable (not illustrated) similar to twinax cable 140. In a particular configuration, adjacent twinax cables are each attached similarly to twinax cable 140, as described above. In particular, PCB 110 may have a first ground structure, a pair of signal structures, and a second ground structure for a first twinax cable adjacent to a third ground structure, a pair of signal structures, and a fourth ground structure for a second twinax cable. This configuration may be described using "G" for ground structures and "S" for signal structures, as a GSSGGSSG type configuration. It will be noted that the GSSGGSSG type configuration utilizes a large amount of space on PCB 110. In another configuration, adjacent twinax cables are attached such that each adjacent twinax cable shares a common ground structure. In particular PCB 110 may have a first ground structure, a pair of signal structures, a second ground structure, a second pair of signal structures, and a third ground structure. This configuration may be described as a GSSGSSG type configuration. It will be understood that the GSSGSSG type configuration utilizes less space on PCB 110 than the GSSGGSSG type configuration.

It has been understood by the inventors of the current disclosure that paddle card as known in the art, such as paddle card 100, may suffer from widely varying impedances in the signal traces. For example, a microstrip on one surface of a paddle card may exhibit impedances above a particular threshold, such as 75 $\Omega$(ohm), while microstrip traces on the other surface may fall below the threshold. In another example, signal traces in the typical paddle card transit through at least two vias: from the connector at the surface to an interior layer, and from the interior layer to the surface at the twinax cable. Moreover, it has been understood the GSSGGSSG type configuration utilizes more space, but provides better shielding for the differential signals than the GSSGSSG configuration. As such, it may be advantageous to provide a paddle card that is configured to reduce the amount of space utilized in connecting twinax cables to the PCB, to improve the shielding of the differential signals, and to improve the impedance characteristics of the traces in the PCB.

Figure 2:
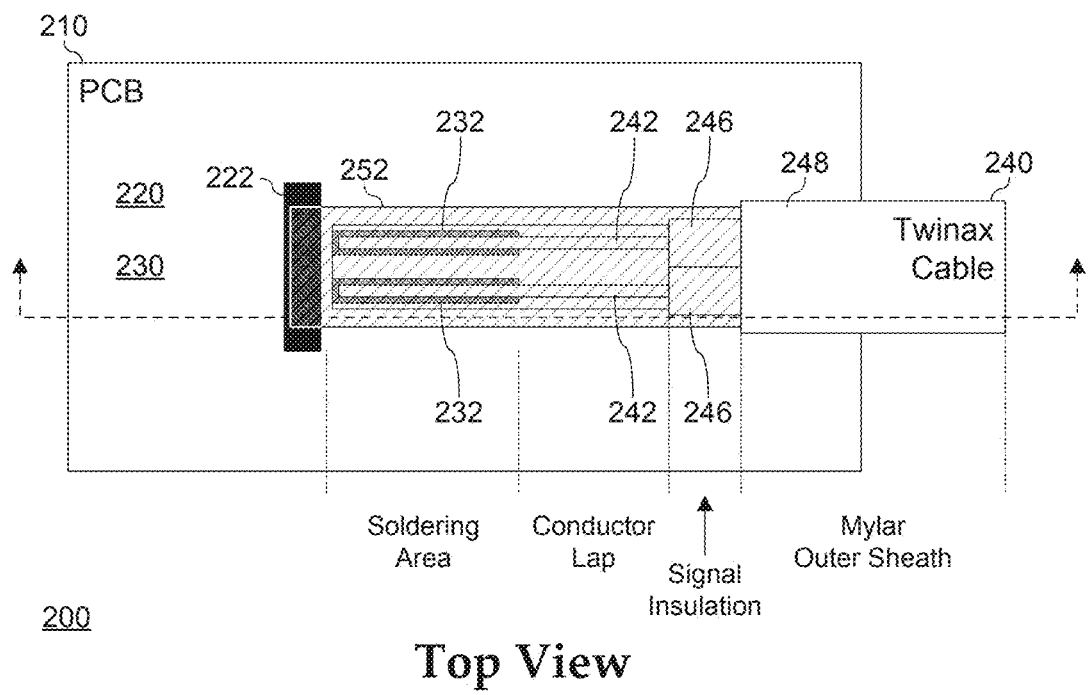
FIG. 2 is a diagram illustrating a paddle card according to an embodiment of the present disclosure.
Figure 2:
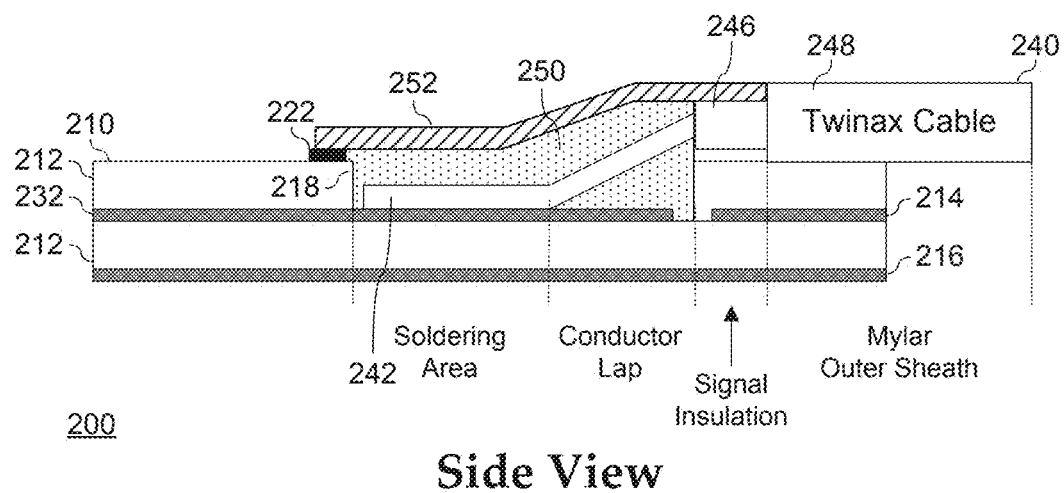

FIG. 2 illustrates an embodiment of a paddle card 200. Paddle card 200 is illustrated in a top view and in a side view, and includes a printed circuit board (PCB) 210 and a twin axial (twinax) cable 240. Paddle card 200 provides functions and features similar to paddle card 100, as described above, and includes a signal reference ground structure 220 and differential signal structures 230. Ground structure 220 includes a ground pad 222 that is connected to one or more ground via (not illustrated) that is in turn connected to a ground layer (not illustrated) within PCB 210. Signal structures 230 include signal pads 232 on a metal layer 214 within PCB 210. In particular, ground pad 222 is formed on a top surface of an insulating layer 212, while signal pads 232 are formed on a bottom surface of the insulating layer in a cavity 218 formed in the insulating layer. In this regard, signal pads 232 can be understood to be synonymous with signal traces formed in a metal layer 214 on a bottom surface of insulating layer 212. PCB 210 may further include one or more insulating layer 212 and one or more metal layer 216, as needed or desired.

Twinax cable 240 includes a pair of signal wires 244, signal insulation 246, and an outer mylar sheath 248. In a particular case, twinax cable 240 is configured to provide differential signals on signal wires 244, and each signal wire is surrounded by signal insulation 246. Typically, ground wires (not illustrated) are provided in a line with, and outside of signal wires 244 to provide a reference ground to the differential signals carried on the signal wires. The assembly of the ground wires, signal wires 244, and signal insulation 244 is typically wrapped with a shielding layer, such as an aluminum foil wrapping or the like, and mylar sheath 248 encloses the entire assembly. Other configurations of twinax cable are known in the art, and may be utilized in keeping with the current embodiment.

In assembling paddle card 200, cavity 218 is formed in insulating layer 212 to expose signal pads 232 on metal layer 214. Next, twinax cable 240 is stripped to expose signal wires 242, the exposed signal wires are soldered to signal pads 232. An epoxy resin 250 is applied to the exposed wires and solder joints. Epoxy resin 250 is applied to protect signal wires 242 and the solder joints, and to assist in the mechanical attachment of the twinax cable to PCB 210. As such, the interconnection between PCB 210 and twinax cable 240 may be divided up into a soldering area, a conductor lap area, a signal insulation area, and a mylar sheath area. The soldering area is where wires 242 are soldered to pads 232. The conductor lap area is where the wires transition from a height where the wires emerge from the twinax cable to the surface of the PCB. The signal insulation area is where signal insulation 246 emerges from twinax cable 240. The mylar sheath area represents the bulk of twinax cable 240.

In a final step, an electromagnetic interference (EMI) shielding 252 is affixed atop epoxy resin 250 and electrically connected to ground pad 222 to provide an EMI shield for the differential signals carried on wires 242. In particular, EMI shielding 252 can be soldered to ground pad 222, can be affixed to the ground pad by a conductive adhesive material, or otherwise electrically connected to the ground pad, as needed or desired. Further, EMI shielding 252 can be electrically connected to ground wires (not illustrated) of twinax cable 240, to a shielding layer (not illustrated) such as an aluminum foil layer wrapped around the wires of the twinax cable, or otherwise connected to grounding or shielding structures of the twinax cable. For example, EMI shielding 252 can be formed in the process of stripping twinax cable 240. Here, the shielding layer can be separated from the ground wires and signal wires 242, can be formed over cavity 218, and can be electrically connected to ground pad 222. In this way, the shielding layer of twinax cable 240 can be provided at a common ground plane as is provided by ground pad 222.

Paddle card 200 may include one or more additional twinax cable (not illustrated) similar to twinax cable 240. In a particular configuration, adjacent twinax cables are each attached similarly to twinax cable 240, as described above. Note that paddle card 200 optimizes the ability to place multiple twinax cables to PCB 210 in closer proximity than either the GSSGGSSG type configuration or the GSSGSSG type configuration of paddle card 100, as described above, because ground wires of twinax cable 240 are either unused (an hence not connected to separate ground pads), or are electrically connected to EMI shielding 252, as described above. Note further that signal wires 242 are routed directly to metal layer 214 without the need for signal vias to route the signal from the metal layer of PCB 210 to metal layer 214, as was the case with paddle card 100, as described above. Thus the construction of paddle card 200 provides better control of the impedances of signal wires 242.

Figure 3:
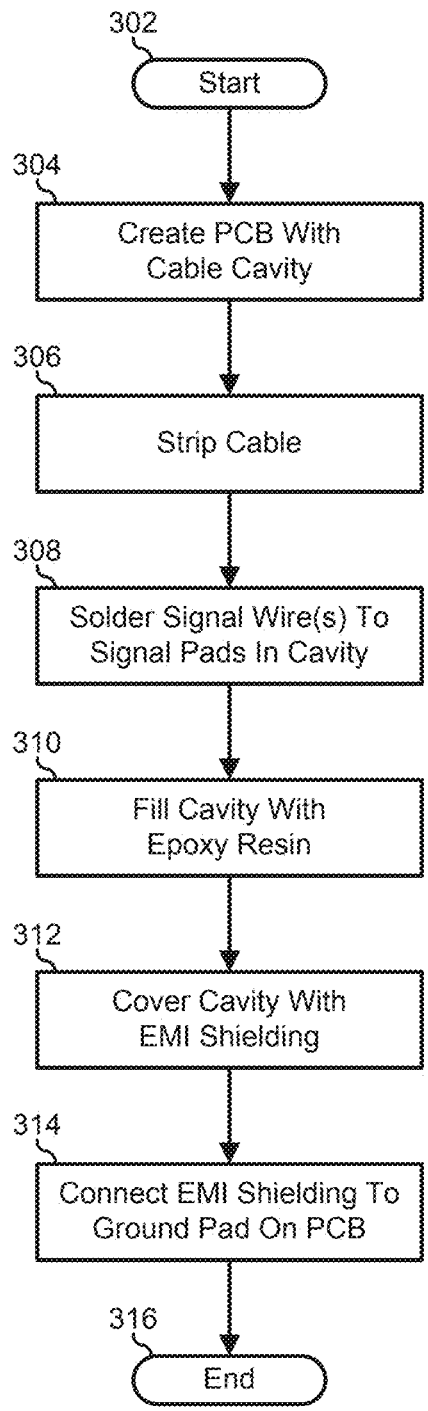
FIG. 3 is a flowchart illustrating a method for assembling a paddle card according to an embodiment of the present disclosure.

FIG. 3 illustrates a method 300 for assembling a paddle card, starting at block 302. A PCB is fabricated with a cavity, such as cavity 218, in block 304. A cable, such as twinax cable 240, is stripped to expose one or more signal wire, such as signal wire 242, in block 306. The signal wire is soldered to a signal pad, such as signal pad 232, in the cavity of the PCB in block 308. The cavity is filled with a resin epoxy, such as resin epoxy 250, to protect the solder joint and the signal wire in block 310. The cavity is covered with EMI shielding, such as EMI shielding 252, in block 312. The EMI shielding is electrically connected to a ground pad, such as ground pad 222, in block 314, and the method ends in block 314.

Figure 4:
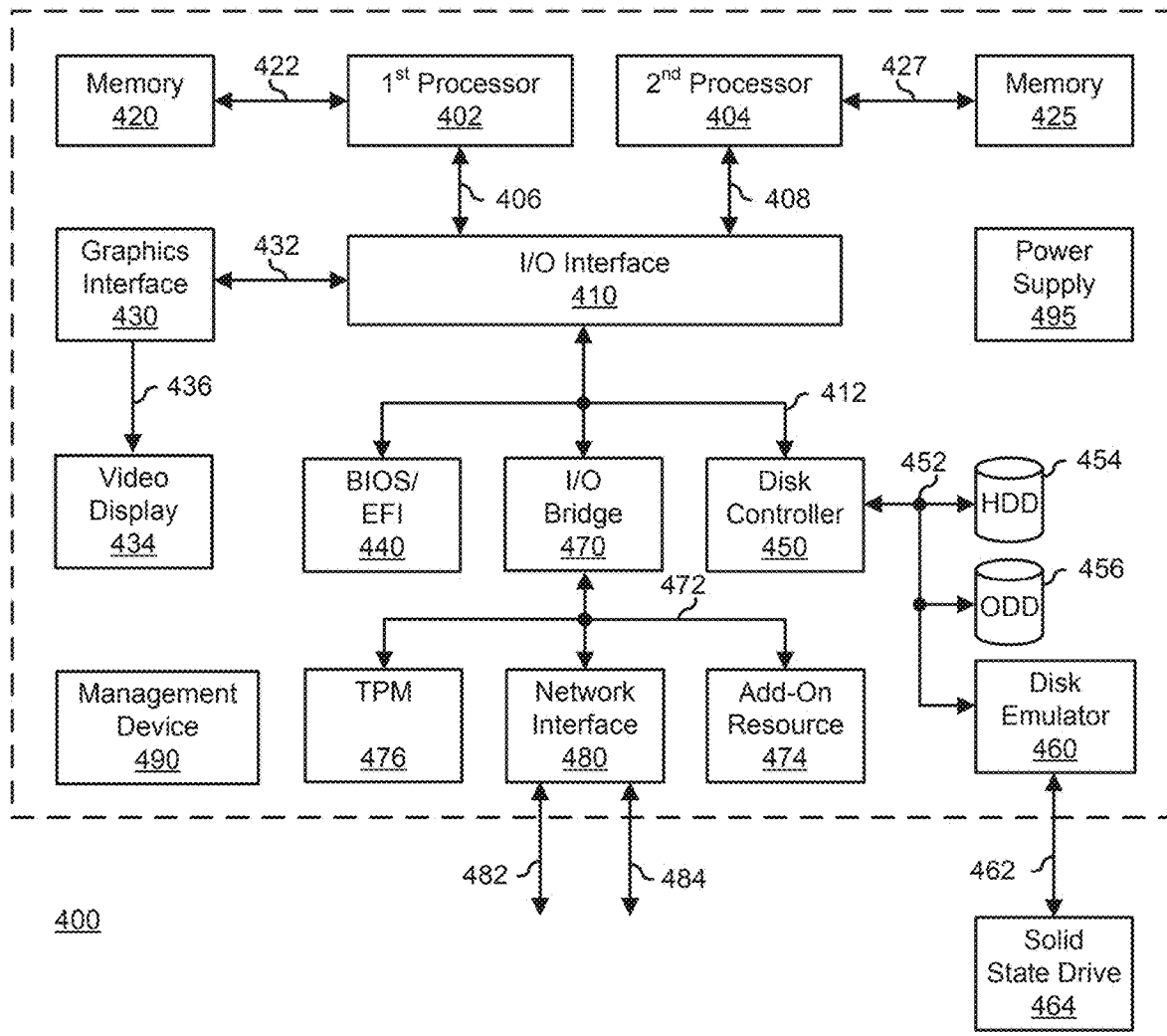
FIG. 4 is a block diagram illustrating a generalized information handling system according to another embodiment of the present disclosure.

FIG. 4 illustrates a generalized embodiment of an information handling system 400 similar to information handling system 400. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described below, and operates to perform one or more of the methods described below. Information handling system 400 includes a processors 402 and 404, an input/output (I/O) interface 410, memories 420 and 425, a graphics interface 430, a basic input and output system/universal extensible firmware interface (BIOS/UEFI) module 440, a disk controller 450, a hard disk drive (HDD) 454, an optical disk drive (ODD) 456, a disk emulator 460 connected to an external solid state drive (SSD) 462, an I/O bridge 470, one or more add-on resources 474, a trusted platform module (TPM) 476, a network interface 480, a management device 490, and a power supply 495. Processors 402 and 404, I/O interface 410, memory 420, graphics interface 430, BIOS/UEFI module 440, disk controller 450, HDD 454, ODD 456, disk emulator 460, SSD 462, I/O bridge 470, add-on resources 474, TPM 476, and network interface 480 operate together to provide a host environment of information handling system 400 that operates to provide the data processing functionality of the information handling system. The host environment operates to execute machine-executable code, including platform BIOS/UEFI code, device firmware, operating system code, applications, programs, and the like, to perform the data processing tasks associated with information handling system 400.

In the host environment, processor 402 is connected to I/O interface 410 via processor interface 406, and processor 404 is connected to the I/O interface via processor interface 408. Memory 420 is connected to processor 402 via a memory interface 422. Memory 425 is connected to processor 404 via a memory interface 427. Graphics interface 430 is connected to I/O interface 410 via a graphics interface 432, and provides a video display output 436 to a video display 434. In a particular embodiment, information handling system 400 includes separate memories that are dedicated to each of processors 402 and 404 via separate memory interfaces. An example of memories 420 and 430 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 440, disk controller 450, and I/O bridge 470 are connected to I/O interface 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 410 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 440 includes BIOS/UEFI code operable to detect resources within information handling system 400, to provide drivers for the resources, initialize the resources, and access the resources. BIOS/UEFI module 440 includes code that operates to detect resources within information handling system 400, to provide drivers for the resources, to initialize the resources, and to access the resources.

Disk controller 450 includes a disk interface 452 that connects the disk controller to HDD 454, to ODD 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits SSD 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O bridge 470 includes a peripheral interface 472 that connects the I/O bridge to add-on resource 474, to TPM 476, and to network interface 480. Peripheral interface 472 can be the same type of interface as I/O channel 412, or can be a different type of interface. As such, I/O bridge 470 extends the capacity of I/O channel 412 where peripheral interface 472 and the I/O channel are of the same type, and the I/O bridge translates information from a format suitable to the I/O channel to a format suitable to the peripheral channel 472 where they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as I/O interface 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Management device 490 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 400. In particular, management device 490 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 400, such as system cooling fans and power supplies. Management device 490 can include a network connection to an external management system, and the management device can communicate with the management system to report status information for information handling system 400, to receive BIOS/UEFI or system firmware updates, or to perform other task for managing and controlling the operation of information handling system 400. Management device 490 can operate off of a separate power plane from the components of the host environment so that the management device receives power to manage information handling system 400 where the information handling system is otherwise shut down. An example of management device 490 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 490 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A paddle card, comprising:
   a printed circuit board (PCB) including a first metal layer on a top surface of the PCB, a second metal layer within the PCB, and a first cavity in the top surface of the PCB, wherein the first cavity exposes the second metal layer at a first location, wherein the first metal layer includes a first ground pad and the second metal layer includes a first signal pad located within the first cavity;
   a first shielded cable including a first signal conductor coupled to the first signal pad; and
   a first electromagnetic interference (EMI) shield coupled to the first ground pad and covering the first cavity.

2. The paddle card of claim 1, wherein the first shielded cable includes a shield layer surrounding the first signal conductor.

3. The paddle card of claim 2, wherein the shield layer is coupled to the first EMI shield.

4. The paddle card of claim 1 further comprising:
   a resin epoxy that fills the first cavity.

5. The paddle card of claim 4, wherein the first EMI shield is affixed atop the resin epoxy.

6. The paddle card of claim 1, wherein the second metal layer includes a second signal pad, and the first shielded cable further includes a second signal conductor coupled to the second signal pad.

7. The paddle card of claim 6, wherein the first signal conductor and the second signal conductor carry a differential signal.

8. The paddle card of claim 1, wherein:
   the PCB further includes a second cavity in the top surface of the PCB, wherein the second cavity exposes the second metal layer at a second location, wherein the first metal layer further includes a second ground pad and the second metal layer further includes a second signal pad located within the second cavity; and the paddle card further comprises:
  a second shielded cable including a second signal conductor coupled to the second signal pad; and
  a second EMI shield coupled to the second ground pad and covering the second cavity.

9. The paddle card of claim 1, wherein the ground pad is coupled to a ground plane of the PCB.

10. The paddle card of claim 1, wherein the first signal pad is coupled to a signal trace within the second metal layer.

11. The paddle card of claim 1, wherein the ground pad is coupled to a ground plane of the PCB.

12. A method for assembling a paddle card, the method, comprising:
  providing, on the paddle card, a printed circuit board (PCB);
  including on the PCB, a first metal layer on a top surface of the PCB, a second metal layer within the PCB, and a first cavity in the top surface of the PCB, wherein the first cavity exposes the second metal layer at a first location;
  providing, on the first metal layer, a first ground pad;
  providing, on the second metal layer, a first signal pad located within the first cavity;
  providing, on the paddle card, a first shielded cable including a first signal conductor;
  coupling the first signal conductor to the first signal pad;
  providing, on the paddle card, a first electromagnetic interference (EMI) shield;
  coupling the first ground pad to the first EMI shield; and
  covering the first cavity with the first EMI shield.

13. The method of claim 12, wherein the first shielded cable includes a shield layer surrounding the first signal conductor.

14. The method of claim 13, further comprising:
  coupling the shield layer to the first EMI shield.

15. The method of claim 12 further comprising:
  filling the first cavity with a resin epoxy.

16. The method of claim 15, further comprising:
  affixing the first EMI shield atop the resin epoxy.

17. The method of claim 12, wherein:
  the second metal layer includes a second signal pad, and the first shielded cable further includes a second signal conductor; and
  the method further comprises coupling the second signal conductor to the second signal pad.

18. The method of claim 17, wherein the first signal conductor and the second signal conductor carry a differential signal.

19. The method of claim 12, wherein:
  the PCB further includes a second cavity in the top surface of the PCB, wherein the second cavity exposes the second metal layer at a second location;
  the method further comprises:
    providing, on the first metal layer, a second ground pad;
    providing, on the second metal layer, a second signal pad located within the second cavity;
  providing, on the paddle card, a second shielded cable including a second signal conductor;
  coupling the second signal conductor to the second signal pad;
  providing, on the paddle card, a second electromagnetic (EMI) shield;
  coupling the second ground pad to the second EMI shield; and
  covering the second cavity with the second EMI shield.

20. A paddle card, comprising:
  a printed circuit board (PCB) including a first metal layer on a top surface of the PCB, a second metal layer within the PCB, and a cavity in the top surface of the PCB, wherein the cavity exposes the second metal layer, wherein the first metal layer includes a ground pad and the second metal layer includes a first and second signal pads located within the cavity;
  a first shielded cable including a first signal conductor and a second signal conductor, wherein the first signal conductor is coupled to the first signal pad, and the second signal conductor is coupled to the second signal pad;
  an electromagnetic interference (EMI) shield coupled to the ground pad and covering the cavity; and
  a resin epoxy that fills the cavity.

* * * * *